(12) United States Patent
Cheng et al.

(10) Patent No.: US 10,957,631 B2
(45) Date of Patent: Mar. 23, 2021

(54) ANGLED DIE PAD OF A LEADFRAME FOR A MOLDED INTEGRATED CIRCUIT PACKAGE

(71) Applicant: TEXAS INSTRUMENTS INCORPORATED, Dallas, TX (US)

(72) Inventors: Chung-Ming Cheng, New Taipei (TW); Yuh-Harng Chien, New Taipei (TW); Fu-Kang Lee, New Taipei (TW); Chia-Yu Chang, New Taipei (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/218,102

(22) Filed: Dec. 12, 2018

(65) Prior Publication Data

US 2020/0194345 A1  Jun. 18, 2020

(51) Int. Cl.
| | | |
|---|---|---|
| *H01L 23/495* | (2006.01) | |
| *H01L 21/56* | (2006.01) | |
| *H01L 23/00* | (2006.01) | |
| *H01L 23/28* | (2006.01) | |
| *H01L 21/48* | (2006.01) | |

(52) U.S. Cl.
CPC .... *H01L 23/49503* (2013.01); *H01L 21/4821* (2013.01); *H01L 21/565* (2013.01); *H01L 23/28* (2013.01); *H01L 23/4952* (2013.01); *H01L 24/06* (2013.01); *H01L 24/49* (2013.01); *H01L 24/73* (2013.01)

(58) Field of Classification Search
CPC .......... H01L 23/49503; H01L 21/4821; H01L 21/565
See application file for complete search history.

(56) References Cited

U.S. PATENT DOCUMENTS

| | | | | |
|---|---|---|---|---|
| 5,126,823 | A | * | 6/1992 | Otsuka .............. H01L 23/49575 257/666 |
| 5,155,578 | A | | 10/1992 | Lim et al. |
| 5,640,044 | A | * | 6/1997 | Takehashi ............. H01L 21/565 257/666 |
| 6,544,816 | B1 | | 4/2003 | Lim et al. |
| 9,627,331 | B1 | | 4/2017 | Chien et al. |
| 2007/0105280 | A1 | * | 5/2007 | Li ..................... H01L 23/49541 438/123 |

* cited by examiner

*Primary Examiner* — Errol V Fernandes
(74) *Attorney, Agent, or Firm* — Ronald O. Neerings; Charles A. Brill; Frank D. Cimino

(57) ABSTRACT

A leadframe comprising a plurality of leads, each of the plurality of leads having a proximal end and a distal end opposite the proximal end, the distal ends positioned along a linear axis. The leadframe further comprises a die pad closer to the proximal ends than the distal ends of the plurality of leads and including an edge positioned along a plane that intersects the linear axis at an angle less than 90 degrees.

22 Claims, 5 Drawing Sheets

ANGLED DIE PAD OF A LEADFRAME FOR A MOLDED INTEGRATED CIRCUIT PACKAGE

BACKGROUND

An integrated circuit package can include a leadframe and components electrically coupled by wires. After the components are assembled and connected, an electrically insulating material can encapsulate the electrical components and wires to form a finished product to protect electrical components therein.

SUMMARY

In accordance with at least one example of the disclosure, a leadframe, comprises a plurality of leads, each of the plurality of leads having a proximal end and a distal end opposite the proximal end, the distal ends positioned along a linear axis. The leadframe further comprises a die pad closer to the proximal ends than the distal ends of the plurality of leads and including an edge positioned along a plane that intersects the linear axis at an angle less than 90 degrees.

In accordance with at least another example of the disclosure, an integrated circuit package comprises a first edge of the package, a second edge of the package opposite the first edge, and a first die pad having a first die pad edge extending along a first axis that is less than 90 degrees relative to the first edge. The integrated circuit package further comprises a second die pad having a second die pad edge extending along a second axis that is parallel to the first axis, wherein the second axis is less than 90 degrees relative to the second edge, and at least one wire having opposite ends bonded to the first die and the second die.

In accordance with at least another example of the disclosure, a method of forming an integrated circuit package, comprises patterning a leadframe having a first plurality of leads integral with an angled first die pad and a second plurality of leads integral with an angled second die pad, and securing a first die to the first die pad and a second die to the second die pad. The method further comprises bonding at least one wire to the first die and the second die, and injecting encapsulate along a primary flow path across the first and second die and substantially parallel to and along a linear axis formed by the at least one wire.

BRIEF DESCRIPTION OF THE DRAWINGS

For a detailed description of various examples, reference will now be made to the accompanying drawings in which.

DETAILED DESCRIPTION

Figure 1:
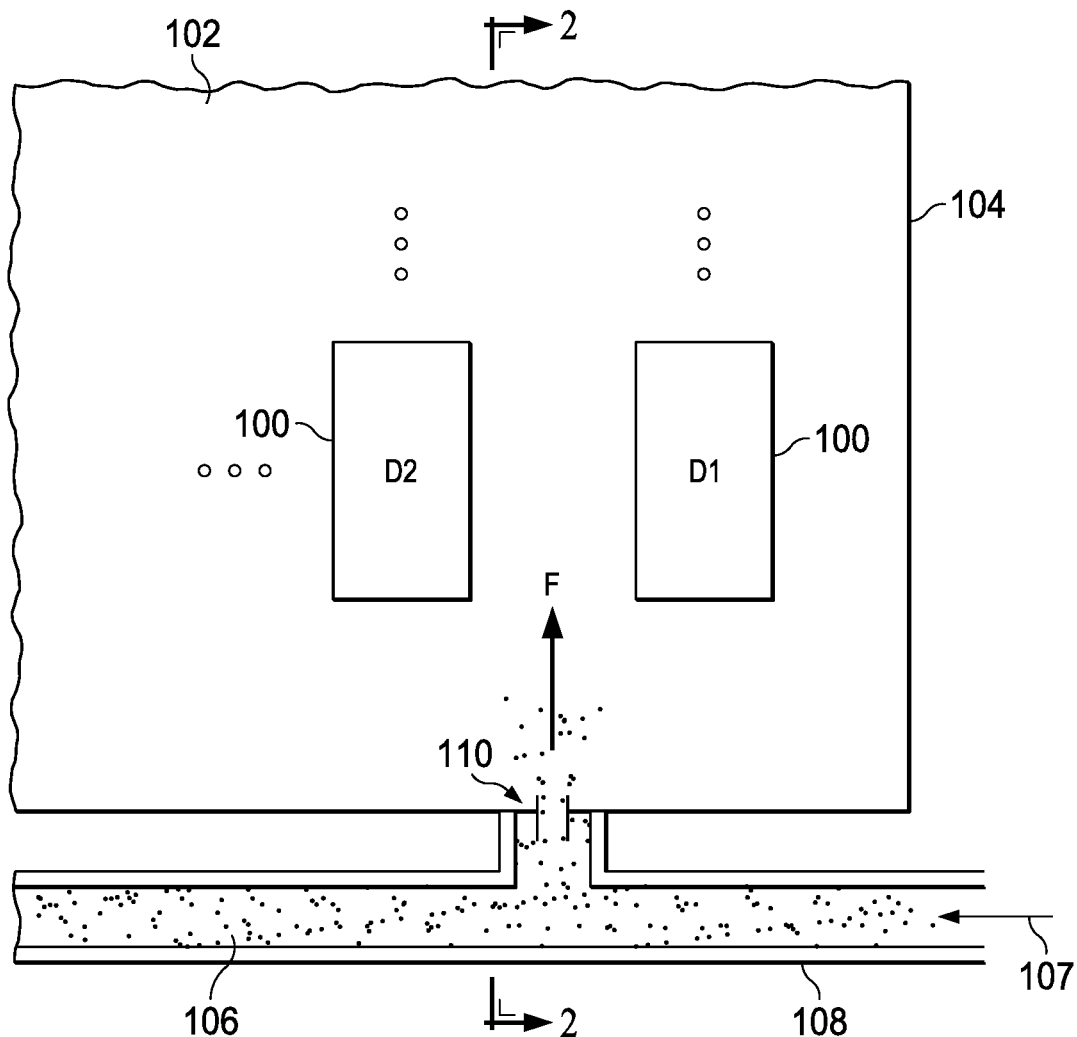
FIG. 1 shows a top plan view of at least one die on a substrate with an encapsulate flow gate and primary flow path in accordance with various examples.

Integrated circuit packages are assembled using leadframes. Each leadframe may include a plurality of leads, tie bars (or dambars), and a die pad. The die pad may be centrally located on the leadframe and can provide a surface on which an Integrated Circuit (IC) die may be mounted. For power devices, the die pad can serve as a heat sink, wherein a lower surface of the die pad may be exposed to dissipate heat from the die.

There are different configurations of leadframes for the many different sizes of IC dies (hereinafter referred to as "die" in singular, or "dies" in plural). A mono-thickness leadframe has the same thickness throughout. A dual-gauge leadframe uses materials having two different thicknesses. The thicker section can be the die pad, and the thinner section can be the leads. A bi-component leadframe involves forming the leadframe and die pad separately, and then attaching the two together with, for example, a mechanical joint. If formed separately and thereafter joined, the die pad can be made much thicker than the leads.

A thicker die pad is able to dissipate more heat away from the die. However, if a thickness of a die pad becomes too thick, it may be difficult to produce the end portions of the inner leads. A fine pitch is typically needed for the end portions of the inner leads, and this becomes difficult to produce with high precision when the die pad is much thicker than the leads. There are different approaches for making a leadframe with thicker die pads than the leads. Regardless of which approach is chosen, a leadframe of an integrated circuit package can have a die pad formed separately from the leads, or formed integral with the leads in a unibody configuration.

In producing the integrated circuit package, it is oftentimes desirable to surround the electrical components using a molding compound, or encapsulate. The encapsulate is a compound which can be injected into a mold to surround the die and a portion of the leadframe and leads. The integrated circuit package is therefore one that may have plastic, epoxy or resin encapsulate packaging material that seals the sensitive electrical components from the outside environment.

Molding techniques that use encapsulate take advantage of the physical characteristics of the mold compounds. These compounds can be thermoset compounds that are cured by radiant energy, thermal energy or ultraviolet light. For example, the encapsulate may be an epoxy, resin or similar material combined with a filler, such as alumina. Other materials such as accelerators, curing agents, fillers, and mold release agents are added to make the compound suitable for molding.

The transfer molding process takes advantage of the viscosity characteristics of the molding compound to cavities between the upper and lower molds, around the die and leadframe. By mounting the die and leadframe between the upper and lower molds, the encapsulate can be injected through gates between the upper and lower molds to fill the cavities. After injection, the encapsulate is cured around the die and leadframe to form a solid, coherent package which is relatively inexpensive, durable, and provides good protective encapsulation for the die.

The transfer molding process can have three stages which correspond to the three phases of viscosity of a thermoset encapsulate compound, for example. First, there can be a preheat stage required to remove the compound from its hard initial state to the low viscosity state. Second, a transfer stage is used to inject the encapsulate compound, which is low in viscosity and easily transported into the cavities via gates between the upper and lower molds. This transfer process can be fairly rapid and is preferably completed before the encapsulate compound sets. In the final stage, or cure stage, the encapsulate compounds can be heat cured. Certain encapsulate may not require heat to cure, such as thermoplastics.

Before the leadframe and die are mounted between upper and lower molds, and before the transfer stage, one or more wires can be bonded to bond pads on one or more die. For example, an electrically conductive wire, or wire loop, can extend between a pair of dies, or between a die and a lead of a leadframe. The electrically conductive wire or wire loop electrically connects the dies together, or a die to a leadframe. The surface of the leadframe, including the die pad, supports the at least one wire to maintain that wire at a predetermined distance from the die or the leadframe during the transfer stage in which the low viscosity encapsulate is injected into the upper and lower molds and around the dies and electrically conductive wires.

The die can be made of semiconductor material, including active and passive semi conductive regions and components. The semiconductor material can comprise silicon germanium, electronic-grade silicon or gallium arsenide, in which one or more functional circuits are formed therein. The bonding pad on the die can be aluminum, and can also include copper, silicon, or gold. A substantially planar surface of the die can be mounted on and secured to the die pad using, for example, epoxy or any other form of adhesion. The surface opposite the surface that is mounted on the die pad can also be relatively planar and covered with a passivation layer except for regions where the bond pads are located. The bond pads can be arranged near the outer periphery or possibly near the center of the planar surface opposite the die pad.

The encapsulation compounds or encapsulates, are especially suitable and developed for high adhesion. During the transfer stage, the epoxy-based thermoset resins and silicone-based elastomerics, as well as liquid-crystal polymers, exhibit low viscosity at room temperature or molding temperatures. Viscosities can range from 50 to 154 poise, glass transition temperatures from 100° C. to 200° C., and filler sizes from 1 to 75 microns with a median from 15 to 25 microns. The molding process parameters can include the following ranges: molding temperature from 140° C. to 220° C., cure times from 70 to 120 seconds, clamping pressure between the upper and lower molds from 18 to 33 tons, transfer times from 5 to 18 seconds, and initial and final transfer pressure between 15 to 80 kg/cm$^2$. With the above parameters, molding profiles for the resulting integrated circuit package can range between 0.15 to 0.3 mm, with profile referring to the thickness or height of the integrated circuit package.

During the transfer stage, after the wires are connected to the die and leads of the leadframe, and the assembly is overmolded with the electrically insulating encapsulate compound, the wires or wire loops can undergo wire sagging and/or wire sweeping. The injected encapsulate enters the cavities from a gate and over the die and wires along a primary flow path. The encapsulate traveling along the primary flow path exerts a force on the wires which cause deformation of the wires from their initial positions. For example, the flowing encapsulate can urge the middle portions of wires downward toward the die or leads, also referred to as wire sagging. Alternatively, or additionally, the flowing encapsulate can urge the middle portions of the wires to move sideways, also known as wire sweeping.

Because the ends of the wires are rigidly fixed to the dies, and specifically the die bonding pads, any wire sagging or sweeping causes the wires to deform. If the sag or sweep causes the height of the wires, or wire loops, to be reduced below a threshold amount, then electrical arching can occur between wires, between wires and dies, or between wires and leads of the leadframe. Such shorting can damage the integrated circuit package, and is therefore undesirable.

In an effort reduce electrical shorting, the wires bonded at least between two dies can be made as a relatively high wire loop. A high loop wire can be one that exceeds a minimum clearance in a middle portion of the group relative to a surface on which the wires are bonded. The International Organization for Standardizations (ISO) Quality Management System (e.g., ISO 9001), underscores the value of high reliability integrated circuit packages and the prevention of shorting due to wire sweep. Making some wires with a high loop configuration can minimize possible wire sagging onto the underlying component. Wire sweep, however, between wires is still an issue, and possibly a greater issue given the added height of the wires, and thus their ability to capture a greater amount of mold flow force.

Wire sweep is defined as the linear deviation of the bond wire from a straight line drawn between a pair of bond spots or regions (i.e., between bond pads of two dies or between a bond pad of a die and a bond region on a lead), as projected on the plane of the leadframe.

The mechanics of wire sweep and the often interrelated factors affecting the viscous fluid flow are complex. However, some of the factors found to influence wire sweep include the upper and lower mold design, and the runner and gating system in which injection occurs along the primary flow path from a gate and across the die. A greater force occurs against the wires if the wires are not properly arranged relative to the gating system. Also, air vent design and flow imbalance can occur if there is blockage in the air vent, which would entrap air thus causing one portion of the cavity to flow faster than the other, subjecting each wire to both tinsel and bending flow. Improper viscosity can also cause wire sweep. If the viscosity is too high, a greater force vector will be applied to the wires. Also, the wire and wire material should be examined. A small addition of beryllium to gold may increase the elastic property of the wire, which can minimize the wire sweep. The molding parameters can also affect wire sweep either through the under heated preheat stage, the transfer pressure, the transfer time, and the injection pressure will all contribute to the amount of linear deviation.

Given that molding pressure, wire and wire material, and viscosity of the encapsulate can vary from different manufacturers and different processes, it is beneficial to minimize wire sweep regardless of the differing molding parameters and wire materials used. Focusing on the orientation of the wires relative to the primary flow path proves a more beneficial solution. One mechanism in which to do so is to arrange the die pad or pads at an angle relative to opposite edges of the resulting integrated circuit package. The die pad angle when viewed from the top down, can look similar to an amoeba, and therefore is alternatively referred to as an amoeba die pad design.

FIG. 1 shows a top plan view of at least one die, marked as D1 and D2, and labeled with reference numeral 100. At least one die can be arranged on a substantially planar surface of a substrate 102. The die 100 and substrate 102 can be confined within a perimeter of a mold 104 shown without the upper mold so as to reveal one or more dies 100, and the substrate 102 (e.g., circuit board) on which the dies 100 are placed.

Mold 104 is configured to accept a pre-packaged product of encapsulate compound. The encapsulate material can be fabricated in various geometric forms, for example, as an elongated, narrow shape reminiscent of a pencil. Once properly prepared, the encapsulate material 106, also referred to herein as encapsulate 106, is forced along arrow 107 into a runner 108 and then through a gate 110 arranged in the side of mold 104. The encapsulate compound is injected from gate 110 along, for example, a primary flow path F that can extend between a pair of spaced dies 100.

The flow rate can be controlled by the force at which encapsulate 106 is inserted into runner 108 and through gate 110. The flow rate can also be controlled by the lengths and cross section of the runner 108, the cross section of gate 110, the temperature of the transfer stage operation, and the viscosity and flow characteristics of the encapsulate compound.

There can be multiple dies 100 arranged in an array, for example. Moreover, there can be multiple gates 110 and primary flow paths F between spaced pair of dies 100. An array arrangement with multiple gates 110 allows the packaging of numerous dies in one transfer molding step, thus achieving a high production efficiency. After the array molding is completed and the encapsulate material 106 is cured, separation of the dies 100 is preferably performed by a process called singulation to yield multiple integrated circuit packages with fairly precise square or rectangular outlines.

Figure 2:
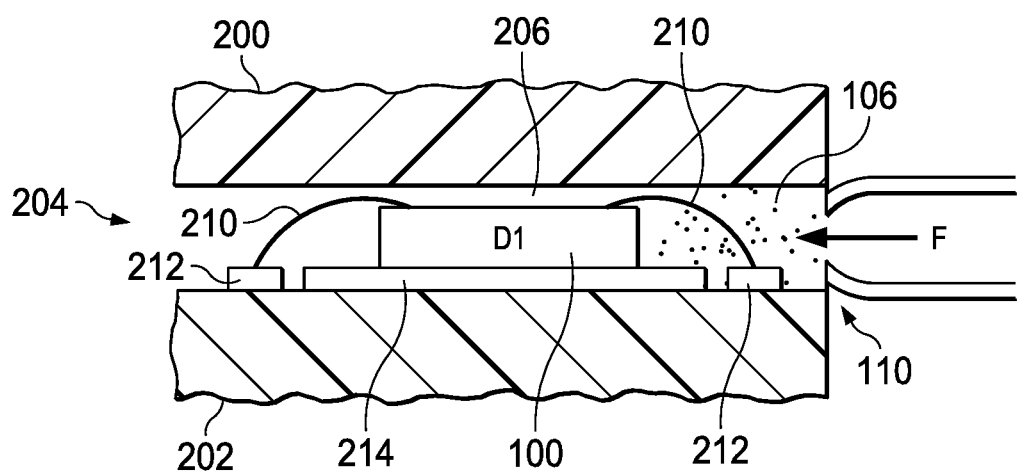
FIG. 2 shows a partial cross section view of upper and lower molds configured around a wire bonded die configured on a die pad in accordance with various examples.

FIG. 2 is a cross section view of upper mold 200 and lower mold 202 along plane 2-2 of FIG. 1. The upper mold 200 and the lower mold 202 form mold 104 with a cavity 204, all of which are shown in partial cross-section. The upper mold 200 need not rest on die 100. Instead, a space 206 can exist between upper mold 200 and die 100 to allow encapsulate 106 to be directed through gate 110. During the transfer stage, space 206 and cavity 204 are substantially filled, and the dies 100 can be covered by a layer of encapsulate 106 applied along the primary flow path F.

In addition to one or more cavities 204 and spaces 206, the encapsulate 106 impinges on at least one wire 210. Wire 210 can be thermosonically bonded to bond pads on die 100, as well as to leads 212 of a leadframe. For example, the ends of wire 210 can be ball bonded, stitch bonded, or any other form of thermosonic or ultrasonic bonding.

If the electrical connection to die 100 occurs from bond pads on an upper surface of die 100, then most likely there would not be electrical connections, such as a ball grid array, on the opposite surface. Instead, on that opposite surface, an adhesive material may be applied. The adhesive material can be a thermally conductive material placed between die 100 and die pad 214 for securing die 100 to die pad 214.

Figure 3:
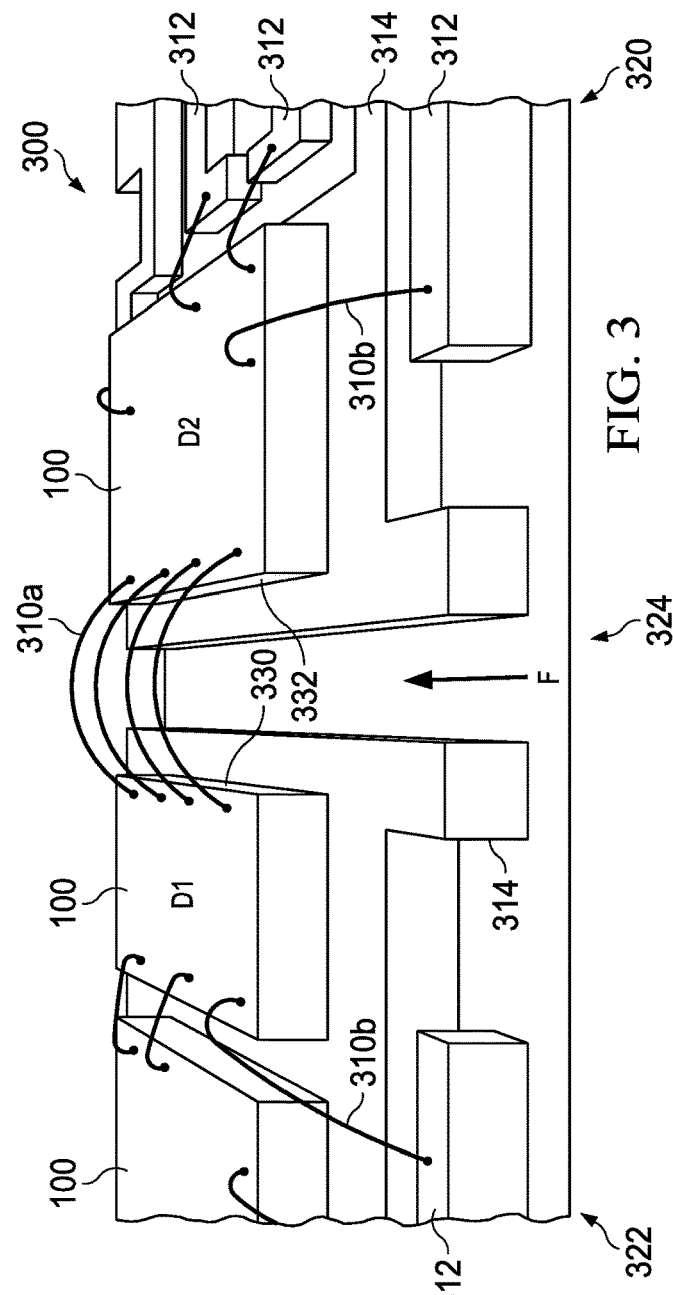
FIG. 3 shows a leadframe having a die pad on which a die is mounted and wire bonded to leads of the leadframe and possibly another die mounted on another die pad in accordance with various examples.

FIG. 3 shows a leadframe 300, according to one example. Leadframe 300 can include a plurality of leads 312 substantially coplanar with a die pad 314. Alternatively, die pad 314 can be made thicker than leads 312, if heat sink properties are required. Leadframe 300 extends generally in a plane from a first end 320 to a second end 322. The leads 312 and the pair of die pads 314 form a network of spaces or gaps 324 therebetween. Leadframe 300 can be formed from a plate of electrically conductive material, such as copper or copper-alloy, which is stamped and/or etched to define the various leads 312, die pads 314 and spaces 324. Alternatively, the die pads 314 can be formed separate from leads 312.

If die pads 314 are integrated with leads 312 during their formation, then leadframe 300 is patterned between first and second ends 320 and 322. Die pads 314 can be either rectangular or square, but can have any shape. The die pads 314 can extend parallel to one another, and can be spaced apart by a space or gap 324. Although two die pads (each labeled 314) are shown, leadframe 300 could include more than two die pads and possibly an array of die pads.

The first die 100, labeled D1, can include an upper surface having an inner edge 330 extending substantially perpendicular to the upper surface. Second die 100, labeled as D2 also includes a planar top surface having an inner edge 332 substantially perpendicular to the upper lower surfaces of D2. In one example, dies 100 can be identical, and the top surfaces can be co-planar with each other. Alternatively, the dies 100 can be different and/or the top surfaces can extend parallel to one another but not co-planar with each other.

One or more electrically conductive wires or wire loops extend between dies D1 and D2, as well as between a die (D1 or D2) 100 and leads 312. The wires between dies 100, and specifically the bond pads of dies 100, can include at least one high loop wire 310a and wires between dies 100 and leads 312 can include at least one low loop wire 310b. As shown, a plurality of high loop wires 310a extend between dies 100. Each wire 310a includes a first end and a second end, and a middle portion extending from the first end to the second end. The first end can be electrically connected to the first die D1, and the second end can be electrically connected to the second die D2. The high loop wires 310 can extend substantially parallel to one other, with the middle portion of each high loop wire extending over gap 324 between a spaced pair of die pads 314. In one example, wires 310a and 310b are gold wires, although other materials, such as copper, can be used to form the wires. The high loop wires 310a can be a different gauge than the low loop wires 310b, if desired.

Figure 4:
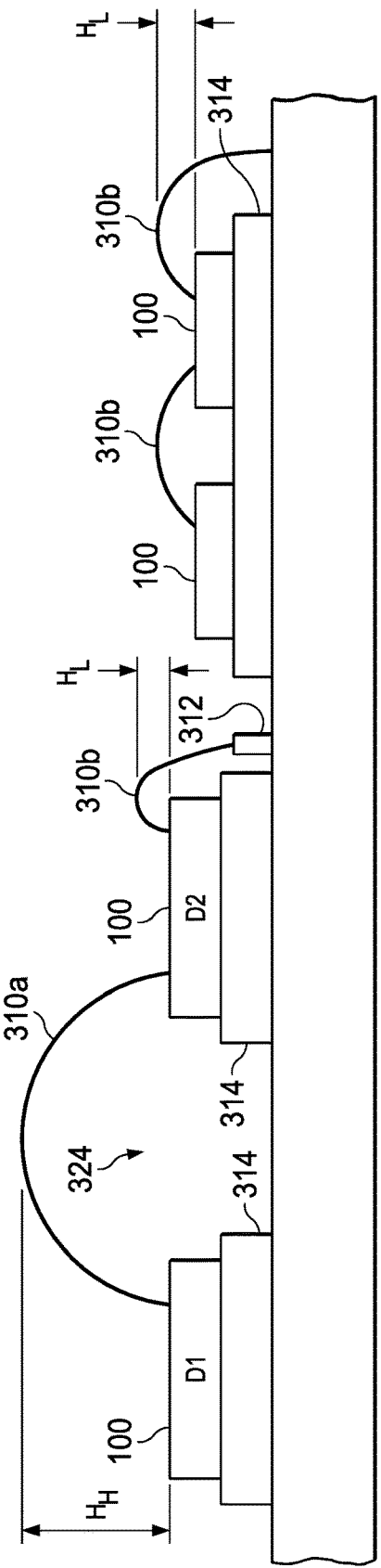
FIG. 4 shows a side view of different wire heights between bond pads or between bond pads and leads in accordance with various examples.

FIG. 4 illustrates in more detail the differences between the high loop wires 310a and the low loop wires 310b. FIG. 4 also shows a side view of other low loop wires 310b placed between leads 312 and dies 100 and also possibly between a pair of dies 100. It is desirable, however, that whenever a gap 324 exists between die pads 314, a high loop wire 310a bridges over that gap between dies 100, also labeled as D1 and D2. Gap 324 allows flow between die pads 314 and overlying dies 100. Making the high loop wire 310a extend a greater distance of $H_H$ above the upper surface of dies 100, more of wire 310a, and specifically the middle portion of wire 310a, can avoid a direct encapsulate flow force along primary flow path F.

The high loop wires 310a and the low loop wires 310b each have a middle portion approximately between the ends of the wires. The middle portions are spaced a predetermined height or distance from dies 100. The high loop wire 310a comprises a middle portion that is at a height $H_H$ above the upper planar surface of dies 100. Height $H_H$ preferably exceeds 200 microns, more preferably exceeds 300 microns, and in the range of 200 microns to 400 microns. The middle portion of low loop wire 310b can be at a height $H_L$ above dies 100 preferably within the range of 150 microns and 200 microns, with an average height $H_L$ approximately 175 microns.

Figure 5:
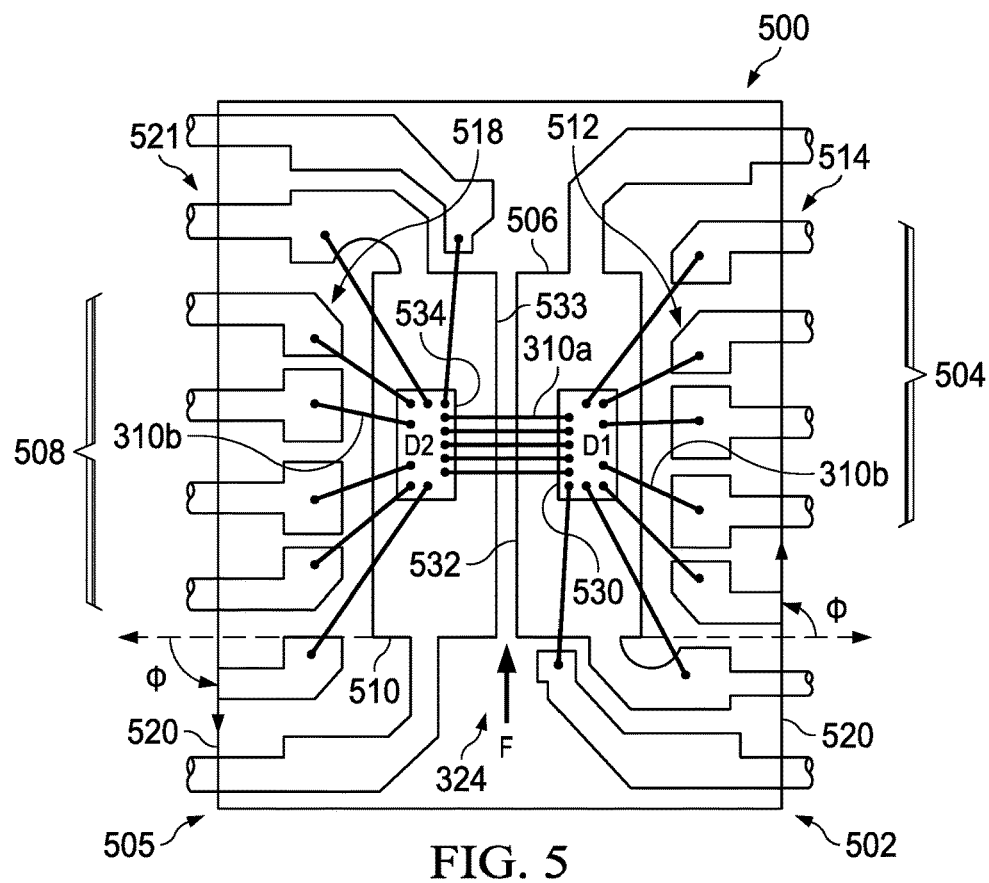
FIG. 5 shows a top plan view of at least one die on a die pad of a leadframe in accordance with various examples.

FIG. 5 shows a top plan view of a leadframe 500. Leadframe 500 can be part of a circuit board, such as a Smaller Aligned Integrated Circuit (SOIC), a Thin Shrink Small Outline Integrated Circuit Package (TSSOP), or a Quad Flat Pack Package (QFP). In whatever form, leadframe 500 is embodied within an integrated circuit package and extends generally in a plane from first end 502 to second end 505.

Leadframe 500 can include a first plurality of leads 504 and a first die pad 506, as well as a second plurality of leads 508 and a second die pad 510. Each of the first plurality of leads 504 includes a proximal end 512 closest to the first die pad 506. Each of the first plurality of leads 504 can also include a distal end 514 that is further than the proximal end 512 from the first die pad 506. Likewise, the second plurality of leads 508 can have a proximal end 518 closer to the second die pad 510 than the distal end 521. As shown, the distal end 514 of the first plurality of leads 504 can extend along a first edge of the integrated circuit package 520 at the first end 502 of leadframe 500. The distal end 521 of the second plurality of leads 508 also extends to the second edge of the integrated circuit package 520 along the second ends 505 of leadframe 500. The pair of dies D1 and D2 can be interconnected with one or more high loop wires 310a and the pair of dies D1 and D2 can also be connected to respective first and second plurality of leads 504 and 508 near corresponding proximal ends 512 and 518 with low loop wires 310b. The high loop wires 310a can extend substantially parallel to one another, with the middle portion of each high loop wire extending over gap 324, between die pads 506 and 510. If the inner edge 530 of die D1 is substantially parallel to the inner edge 532 of die pad 506, and the inner edge 534 of die D2 is substantially parallel to the inner edge 533 of die pad 510, and the bonding pads along dies D1 and D2 which accommodate high loop wires 310a are aligned in a row, then the high loop wires 310a extend not only substantially parallel to one another but also substantially orthogonal to the primary flow path F. Rectangular first and second die pads 506 and 510 can also be shown having an edge of the first and second die pads 506 and 510 extending approximately θ=90° relative to the linear access formed along the distal ends 514 and 521 of the first and second plurality of leads 504 and 508, respectively. Configuring the first and second die pads 506 and 510 so that corresponding edges of those die pads extend approximately 90° relative to a linear access on opposite edges of the integrated circuit package 520, or distal ends 514 and 521 of first and second plurality of leads 504 and 508, respectively, contributes to the high loop wires 310a placed substantially perpendicular to the linear primary flow path F, thereby contributing to wire sweep of those wires during the injection stage.

Figure 6:
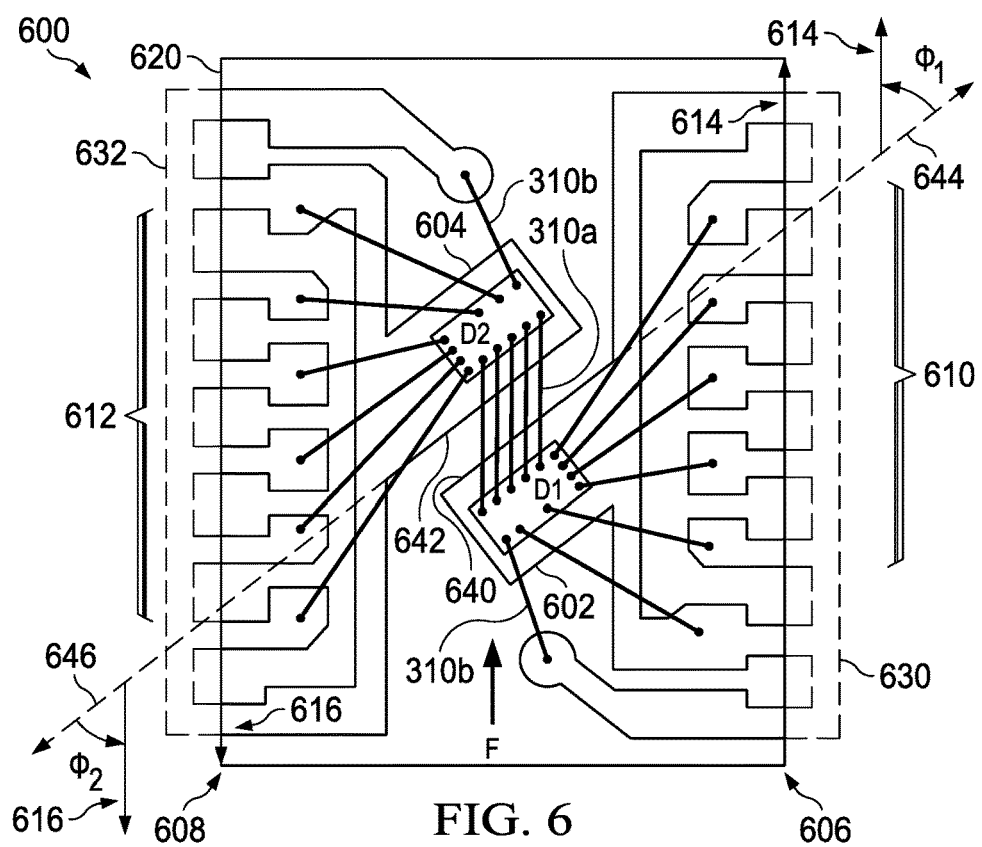
FIG. 6 shows a top plan view of at least one die on an angled die pad of a leadframe in accordance with various examples.

FIG. 6 illustrates a more preferred arrangement for first and second die pads 602 and 604 of leadframe 600. FIG. 6 shows a top plan view of two dies D1 and D2 mounted on respective first die pad 602 and second die pad 604. The first and second die pad 602 and 604 can be angled, and the corresponding dies D1 and D2 may also be angled relative to the first and second ends 606 and 608 of leadframe 600. The first end 606 of leadframe 600 represents the distal ends of a first plurality of leads 610, whereas the second end 608 corresponds to the distal ends of the second plurality of leads 612. A first axis 614 is formed along the distal ends of the first plurality of leads 610, and a second axis 616 is formed along the distal ends of the second plurality of leads 612. The first axis 614, as well as the second axis 616, are drawn twice. Both axes 614 and 616 are drawn along the actual axis on the outside edge of the packaged integrated circuit 620 and, also for purposes of clarity in the drawing, along a parallel axis outside the opposing outside edge of the packaged integrated circuit. The latter is provided only for purposes of clarity with both axes 614 and 616 show angles φ1 and φ2.

The first and second axes 614 and 616 not only are formed along the distal ends of first and second plurality of leads 610 and 612, respectively, but also along opposite edges of the packaged integrated circuit 620. The first axis 614 extends along the line and can have a vector or direction shown with an arrow along one edge of the packaged integrated circuit 620. The second axis 616 can also have a vector or direction extending along the axis and shown with an arrow that extends parallel to the first axis 614 and on the opposite edge of integrated circuit package 620. The first direction of first axis 614 preferably extends in an opposite direction from the second direction of the second axis 616, parallel to each other and on opposite edges of the integrated circuit package 620.

Conventional transfer molding or encapsulation techniques often require leadframes with tie bars or dambars. FIG. 6 illustrates the formation of opposite edges of the integrated circuit package 620 by the removal of dambars 630 and 632. Within leadframe 600, the first and second plurality of leads 610 and 612 are shown in dashed lines coupled together outside of the outer, opposing edges of the integrated circuit package 620. Dambars 630 and 632 serve to couple the first and second plurality of leads 610 and 612 together in a substantially coplanar arrangement between the upper and lower molds. The upper and lower molds have an inner surface to receive the encapsulate through a gate and along the primary flow path F such that, after cure, the molds are removed and the opposing edges of the resulting integrated circuit package 620 still have dambars 630 and 632 extending laterally beyond those opposing edges.

Dambars 630 and 632 not only maintain the leads and die pads in their proper orientation and provide support thereto during the transfer stage, but also act as a physical stop to prevent overmolding of the encapsulate from flowing out from the cavity area of the mold chases and forming a joint between adjacent leads. Dambars 630 and 632 are then typically required to mold the integrated circuit package 620. However, after the integrated circuit package 620 is molded, and the encapsulate cured, dambars 630 and 632 can be removed as shown by the dashed lines in FIG. 6. Dambars 630 and 632 are removed and the flash between leads is removed using, for example, a metal trim and compound deflash technology. Once the integrated circuit package 620 is therefore completed and cured, the dambars 630 and 632 are no longer needed for stability and are removed to electrically separate the first and second plurality of leads 610 and 612 from each other. Removal of clambers 630 and 632 can yield an integrated circuit package 620 having fine pitch leads along, for example, opposing edges of integrated circuit package 620, and can also yield corresponding first and second linear axes 614 and 616 extending along those edges in opposite directions.

First and second die pads 602 and 604 can be rotated, or angled, relative to the opposing edges of the integrated circuit package 620. A first edge 640 of the first die pad 602 can extend along a first direction shown in dashed line 644. The direction of first die pad axis 644 is also shown to extend across the first edge of the integrated circuit package 620 at an angle less than 90°. The first axis 644 of the first die pad 602 extends less than 90°, and preferably extends less than 60° as φ1, relative to the first axis 614 along the edge of integrated circuit package 620. Likewise, a second edge 642 of the second die pad 604 extends along a second direction shown in dashed line 646. The direction of the second die pad axis 646 is also shown to extend across the second edge of the integrated circuit package 620 at an angle φ2 less than 90°. First and second axes 644 and 646 (i.e., directions of each) can be parallel to each other, and extend in substantially opposite directions.

By angling the die pads 602 and 604, as well as possibly angling the dies D1 and D2 the same amount or different from the die pads 602 and 604 the high loop wires 310a can maintain their parallel relationship to each other along the primary flow path F. Placing the wires 310a parallel to and along the primary flow path minimizes any displacement or deformation of those wires when encapsulate is injected from a gate having an opening, for example, along the primary flow path F, Wire sweep, and linear deviation of the wires from a straight line, is minimized by angling the die pads 602 and 604.

Figure 7:
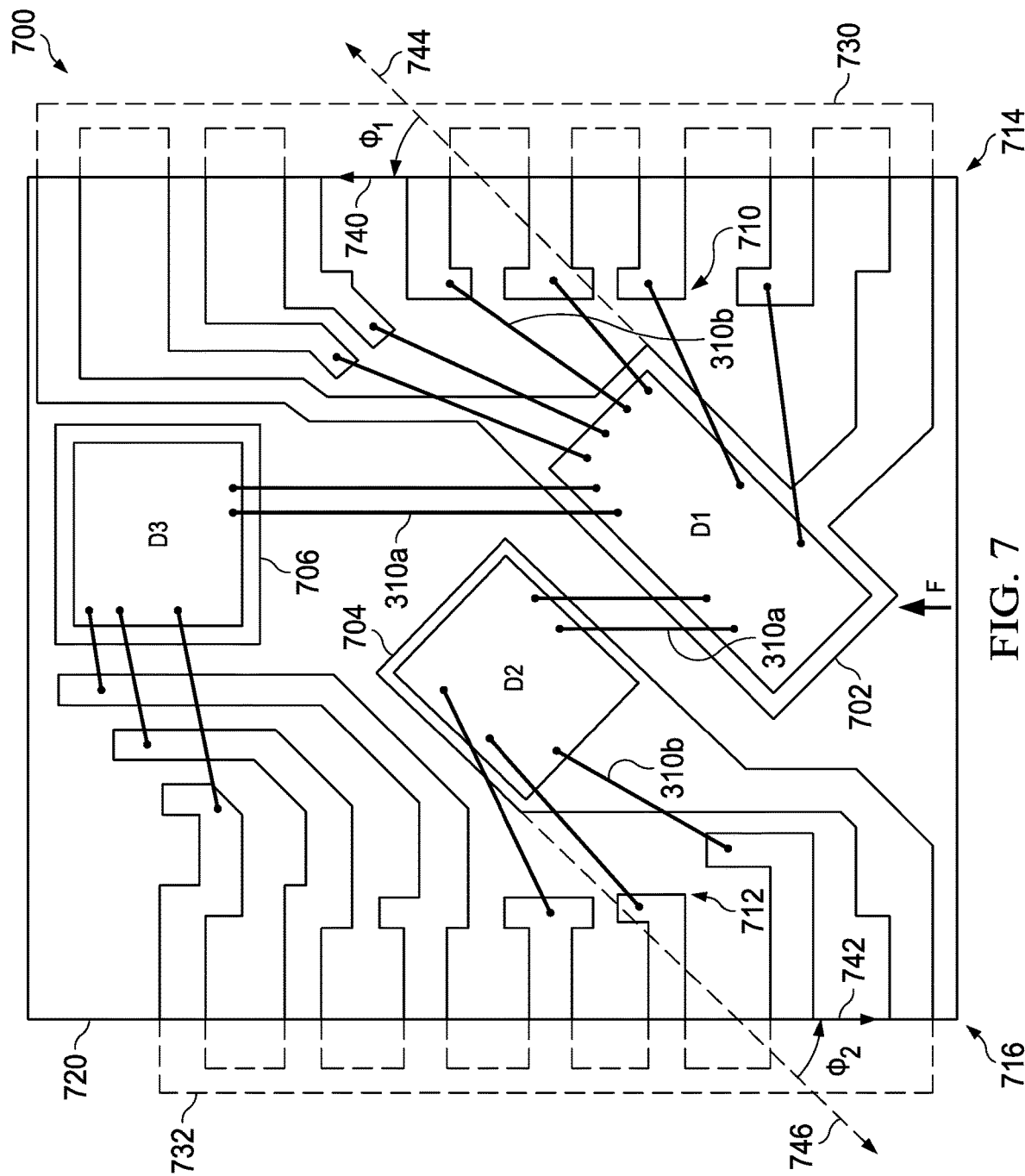
FIG. 7 shows a top plan view of at least three die, two of which are on an angled die pad of a leadframe in accordance with various examples.

FIG. 7 shows a top plan view of at least three die, D1, D2, and D3. Two of which are on an angled die pad 702 and 704, respectively, of leadframe 700. Another die D3 can be on a third die pad 706 of leadframe 700. Die pads 702, 704 and 706 are arranged between proximal ends 710 and 712 of leads within leadframe 700. Moreover, die pads 702, 704 and 706 are arranged between distal ends 714 and 716 which form the opposite edges of the integrated circuit package 720, after dambars 730 and 732 are removed.

Even though die pad 706 is not rotated, or angled, die pads 702 and 704 can be angled. The first linear axis shown along arrow 740 that extends along the distal ends of a first plurality of leads and along one edge of the integrated circuit package 720 is shown forming an angle φ1 relative to the axis 744 along the first edge of first die pad 702. Angle φ1 is preferably less than 90°, and can be less than 60°. Likewise, a second axis 742 is formed along the distal ends of the second plurality of leads and along one edge of integrated circuit package 720 then forms an angle φ2 relative to the second axis along the second edge of the second die pad, labeled 746. Angle φ2 is preferably the same as φ1 with axes 744 and 746 being parallel to each other yet extending in opposite directions.

The arrangement of the angled die pads 702 and 704, as well as possibly the angled dies D1 and D2, allow high loop wires 310a to extend parallel to, and possibly at least one substantially co-linear with, primary flow path F. Also, by angling first die pad 702, the third die pad 706 need not be angled so as to maintain a high loop wire 310a substantially parallel to and co linear with primary flow path F. The arrangement of the die pads, having at least two die pads angled, as shown in FIG. 7, provides the similar benefit as the arrangement of FIG. 6, whereby at least one wire 310a can extend parallel to and substantially coplanar with the primary flow path F so as to minimize wire sweep of those wires 310a.

The low loop wires 310b shown in FIGS. 6 and 7 can be placed at a slight angle from perpendicular, relative to the primary flow path F. The angle from perpendicular preferably exceeds 15°. By extending the low loop wire along a line from one bond location to another offset by at least 15° from perpendicular (relative to the primary flow path F), wire sweep on the low loop wires 310b can also be minimized. The low loop wires 310b do not extend as high as the high loop wires 310a above corresponding upper die surfaces, and thus they can withstand greater sideways forces due to their lessened height even though they are not necessarily parallel to and co linear with the primary flow path F.

Figure 8:
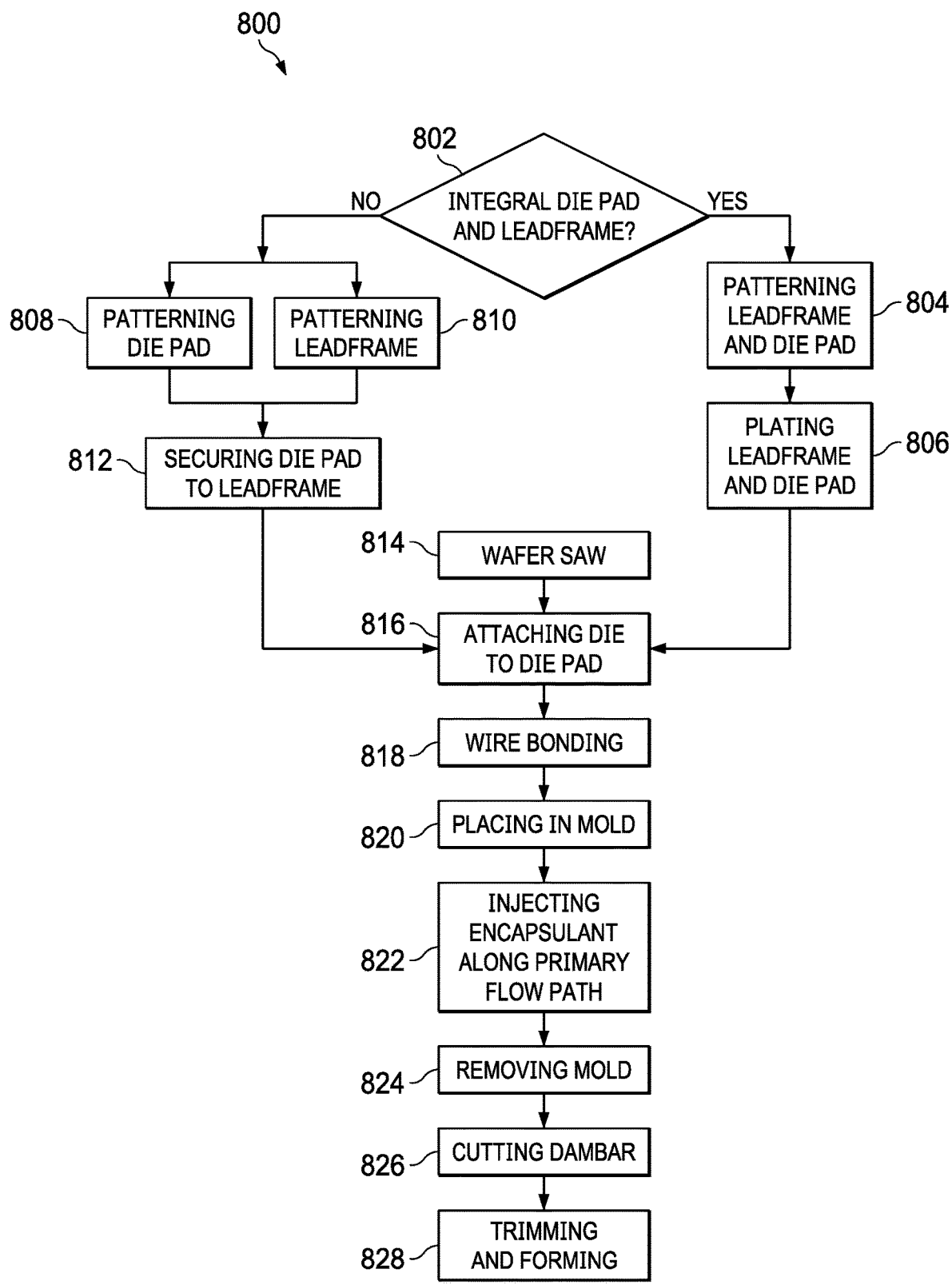
FIG. 8 is a flow diagram of a process of making an integrated circuit package in accordance with various examples.

FIG. 8 is a flow diagram of the process in which an integrated circuit package is manufactured in accordance with various examples. The process or method of forming an integrated circuit package 800 begins by determining the die pad will be integral with or separate from the leadframe 802. If the die pad is to be integral with, as part of a unibody or monolithic structure with a leadframe, then the leadframe which comprises the die pad will be patterned together 804 using, for example, a screen printing process. A material from which the leadframe and die pad are patterned can either be pre-plated with a plating material, or post-plated 806, after patterning. The plating material can be nickel, palladium and/or gold. If the die pad is not integral with the lead frame, then the die pad can be patterned from a structure separate from the leadframe, as shown in blocks 808 and 810. Thereafter, the patterned die pad and patterned leadframe can be secured together using various bond, weld or attachment mechanisms 812.

The die is prepared from a wafer by separating the die from the wafer using a scribe or saw mechanism 814. The separated die can then be attached to corresponding die pads 816 formed either from a monolithic material or separately from the leadframe. Wires are then bonded 818 between pairs of dies and between a die and leads of the leadframe. The leadframe, along with dies secured to die pads and wires secured between dies and leadframe leads, is then placed into a mold 820. Encapsulate can then be injected along a primary flow path across, for example, the first and second dies and substantially parallel to and along a linear axis formed by at least one wire placed between dies 822.

The upper and lower molds can then be removed from the cured encapsulate in block 824, and thereafter the tie bar or dam bar is cut from the opposed edges of the ensuing package at block 826. The leads, which may or may not extend beyond the opposing edges of the package after removal of the dambar, can then be trimmed or formed into whatever package outline is required 828. The patterned die pad, whether integral with the leadframe or not, is preferably patterned at an angle relative to opposing edges of the resulting package.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A leadframe, comprising:
a plurality of leads, each of the plurality of leads having a proximal end and a distal end opposite the proximal end, the distal ends positioned along a linear axis; and
a die pad closer to the proximal ends than the distal ends of the plurality of leads and including an edge positioned along a plane that intersects the linear axis at an angle less than 90 degrees but greater than 45 degrees.

2. The leadframe of claim 1, wherein the angle is less than 60.

3. A leadframe, comprising:
a first plurality of leads, each of the first plurality of leads having a proximal end and a distal end opposite the proximal end, the distal ends positioned along a linear axis;
a die pad closer to the proximal ends than the distal ends of the first plurality of leads and including an edge positioned along a plane that intersects the linear axis at an angle less than 90 degrees;
a second plurality of leads, each of the second plurality of leads having a second proximal end and a second distal end opposite the second proximal end, the second distal ends positioned along a second linear axis; and
a second die pad closer to the second proximal ends than the second distal ends of the second plurality of leads and including a second edge positioned along a second plane that intersects the second linear axis at a second angle less than 90 degrees, a gap separating the first and second die pads.

4. The leadframe of claim 3, wherein the second angle is less than 60 degrees.

5. The leadframe of claim 3, wherein the linear axis and the second linear axis are substantially parallel to each other and comprising a direction for each that is opposite one another.

6. The leadframe of claim 3, wherein a linear primary flow path extends a substantially equal distance between the distal end of each of the plurality of leads and the second distal end of each of the second plurality of leads.

7. The leadframe of claim 6, further comprising:
a first die mounted on the die pad;
a second die mounted on the second die pad; and
at least one wire bonded to bond pads on the first and second dies and extending at a height $H_H$ above the first die, the at least one wire extending substantially parallel to the linear primary flow path.

8. The leadframe of claim 7, wherein the height $H_H$ exceeds 300 microns.

9. The leadframe of claim 3, further comprising:
a first die mounted on the die pad;
a second die mounted on the second die pad; and
at least one wire bonded to bond pads on the first and second dies and extending at a height $H_H$ above the first die, the at least one wire extending substantially parallel to a linear primary flow path.

10. The leadframe of claim 9, wherein the height $H_H$ exceeds 300 microns.

11. An integrated circuit package, comprising:
a first edge of the package;
a second edge of the package opposite the first edge;
a first die pad having a first die pad edge extending along a first axis that is less than 90 degrees relative to the first edge;
a second die pad having a second die pad edge extending along a second axis that is parallel to the first axis, wherein the second axis is less than 90 degrees relative to the second edge; and
at least one wire having opposite ends bonded to the first die and the second die.

12. The integrated circuit package of claim 11, wherein the first axis comprising a first direction and the second axis comprising a second direction, and wherein the first direction is opposite the second direction, and wherein the first axis extends less than 60 degrees relative to the first edge, and wherein the second axis extends less than 60 degrees relative to the second edge.

13. The integrated circuit package of claim 11, further comprising a substantially linear primary flow path extending parallel to and between the first edge and the second edge.

14. The integrated circuit package of claim 11, further comprising a substantially linear primary flow path extending parallel to and substantially equal distance between the first edge and the second edge.

15. The integrated circuit package of claim 11, further including:
a first die mounted on the die pad;
a second die mounted on the second die pad; and
at least one wire bonded to bond pads on the first and second dies and extending at a height $H_H$ above the first die, the at least one wire extending substantially parallel to the linear primary flow path.

16. The integrated circuit package of claim 11, wherein the at least one wire extends substantially co-linear with the primary flow path.

17. The integrated circuit package of claim 13, further comprising:
a first die mounted on the die pad;
a second die mounted on the second die pad; and
the at least one wire having opposite ends bonded to the first die and the second die extending at a height $H_H$ above the first die, the at least one wire extending substantially parallel to the linear primary flow path.

18. The integrated circuit package of claim 17, wherein the height $H_H$ exceeds 300 microns.

19. The integrated circuit package of claim 11, further comprising:
a first die mounted on the die pad;
a second die mounted on the second die pad; and
the at least one wire having opposite ends bonded to the first die and the second die extending at a height $H_H$ above the first die.

20. The integrated circuit package of claim 15, wherein the at least one wire extends to a height H exceeding 300 microns above the first die mounted on the first die pad or above the second die mounted on the second die pad.

21. The integrated circuit package of claim 20, wherein the at least one wire further extends substantially parallel to the primary flow path.

22. The integrated circuit package of claim 15, further including mold compound covering the die pad, the second die pad, the first die, the second die and the at least one wire.

* * * * *